United States Patent [19]

Fujioka

[11] Patent Number: 4,677,540
[45] Date of Patent: Jun. 30, 1987

[54] AC MOTOR CONTROL PANEL

[75] Inventor: Yoshiki Fujioka, Higashiyamato, Japan

[73] Assignee: Fanuc Ltd, Minamitsuru, Japan

[21] Appl. No.: 834,239

[22] PCT Filed: Jun. 18, 1985

[86] PCT No.: PCT/JP85/00346

§ 371 Date: Feb. 13, 1986

§ 102(e) Date: Feb. 13, 1986

[87] PCT Pub. No.: WO86/00490

PCT Pub. Date: Jan. 16, 1986

[30] Foreign Application Priority Data

Jun. 18, 1984 [JP] Japan ................. 59-124749

[51] Int. Cl.⁴ .............................. H02M 7/00
[52] U.S. Cl. ................... 363/144; 361/405; 361/419; 439/45
[58] Field of Search ............ 339/18 C, 222; 363/34, 363/131, 144, 145; 307/147–150; 361/331, 334, 380, 390, 392–395, 399, 404, 405, 407, 417, 418, 352, 412, 413

[56] References Cited

U.S. PATENT DOCUMENTS 2,613,287 10/1952 Geiger ................. 339/18 C
2,963,626 12/1960 Duval, Jr. ............ 339/18 C
3,665,287 5/1972 Cross ................... 363/145
4,514,784 4/1985 Williams .............. 361/413

Primary Examiner—G. P. Tolin
Attorney, Agent, or Firm—Staas & Halsey

[57] ABSTRACT

An AC motor control panel includes a short bar substrate (10) which is placed on a connection terminal (14) of an electronic component of an inverter control circuit arranged in a housing. A tubular connection member (17) is inserted into a hole (10b) provided in the short bar substrate 10. A screw (13) is inserted into holes provided in the tubular connected member (17), short bar (15) and connection terminal (14), and the end of the screw (13) is screwed into a nut (18) provided on a lower portion of the connection terminal (14). The connection terminal (14), short bar (15) and tubular connection member (7) are thus electrically interconnected.

15 Claims, 10 Drawing Figures

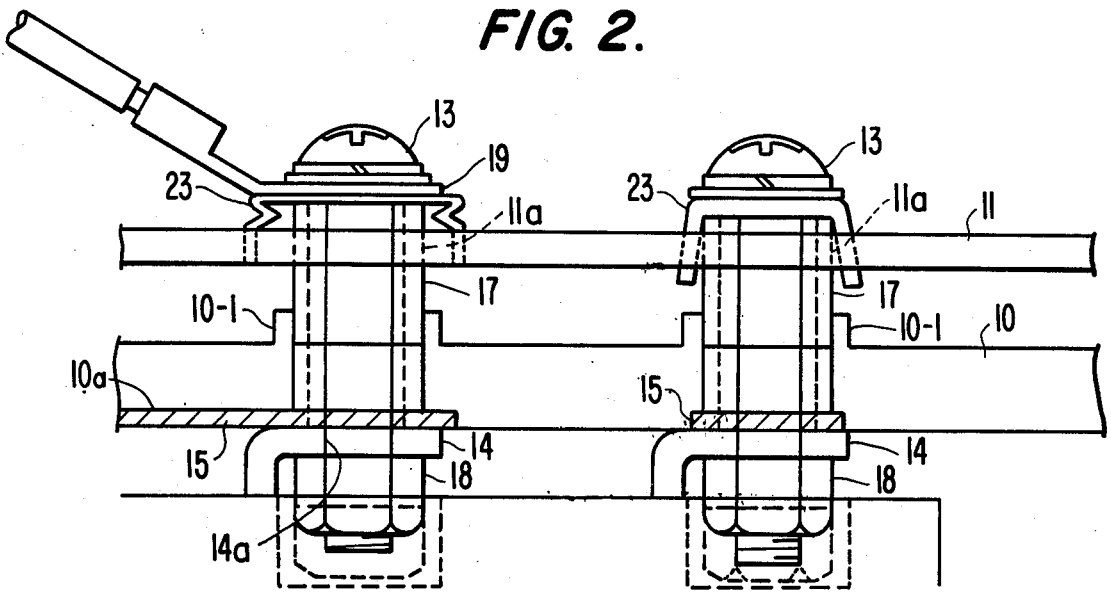
FIG. 2.
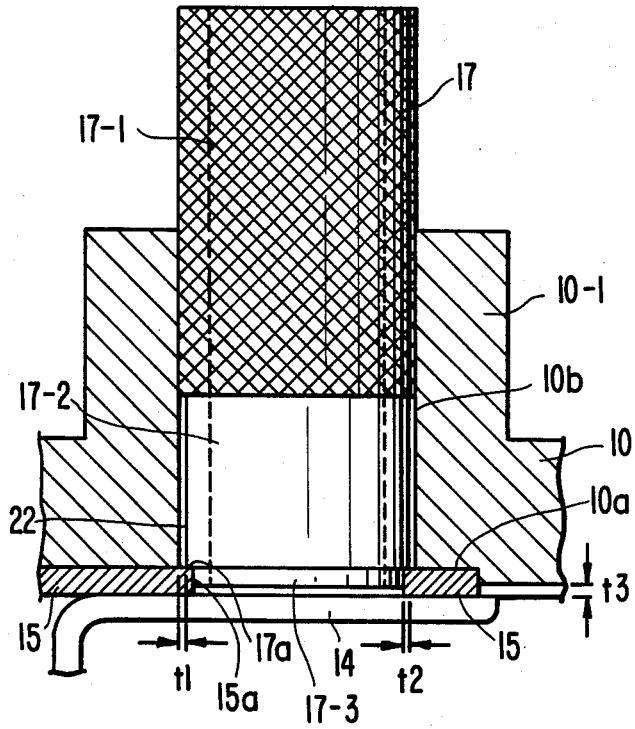
FIG. 3.
FIG. 4(a).
FIG. 4(b).

AC MOTOR CONTROL PANEL

DESCRIPTION

BACKGROUND OF THE INVENTION

This invention relates to a control panel of an AC motor used in various fields, such as for driving the spindle or table of a machine tool.

An AC motor is controlled by an inverter. An inverter control circuit of this type is employed in an arrangement of the kind shown in FIG. 7. Specifically, the inverter control circuit includes an electromagnetic contactor 1, a reactor 2, a diode bridge 4 comprising diodes D1-D6, a smoothing capacitor 5, a discharge transistor 6 for regeneration, and a transistor inverter 7, these being connected to three-phase input terminals R, S, T of an AC motor. The AC motor (not shown) is connected to output terminals U, V, W of the inverter. In FIG. 7, numeral 3 denotes a control transformer, C1-C5 represent surge absorbing capacitors, and R1, R2 designate discharge resistors. Thus, a large number of electrical components are needed to control the AC motor by means of the inverter.

These electrical components are compactly arranged in a resin-molded housing 9 as shown, for example, in FIG. 8. Specifically, electrical components such as the electromagnetic contactor 1, reactor 2, control converter 3, diode bridge 4, smoothing capacitor 5, discharge transistor 6 for regeneration and transistor inverter 7 are arranged at predetermined positions inside the resin-molded housing 9. Each of these electrical components has connection terminals 14 led out onto its upper surface, each connection terminal being designed so as to be located on the same plane.

These electrical components ae interrelated and connected by short bars 15 fixedly secured to a short bar substrate 10 of the kind shown in FIG. 9. Specifically, the short bar substrate 10 having the short bars 15 affixed to its lower surface in correlation with the connection terminals 14 of the electrical components is placed on the electrical components, thereby connecting these electrical components in a predetermined relationship. Each short bar 15 is formed to include holes 16 at locations corresponding to the connection terminals 14 of the electrical components, each hole having a conductor fitted therein.

A printed circuit board (not shown) having electronic components mounted thereon is arranged on the short bar substrate 10 and these electronic components are connected to the electrical component assembly, thereby constructing the AC motor control panel.

Thus, the AC motor control panel comprises various electrical components, each of which is arranged in compact form. Accordingly, it is desired that the electrical connections be made automatically and reliably when each component is assembled. Further, when a control panel of this type fails as the result of a faulty electrical component or the like, it is desired that solely this portion of the control panel be capable of quick restoration.

An object of the present invention is to provide a control panel of the above type, in which the electrical components constituting the inverter control circuit of an AC motor can be electrically connected in reliable fashion at the time of assembly.

SUMMARY OF THE INVENTION

According to the present invention, there is provided an AC motor control panel having an electrical component arranged in a housing and constituting an inverter control circuit of an AC motor, a short bar substrate placed upon a connection terminal led out onto an upper surface of the electrical component and having a short bar, which contacts the connection terminal, fixedly secured thereto, the substrate being equipped with a hole at a portion corresponding to the connection terminal, a tubular connection member inserted into the hole provided in the short bar substrate for contacting the short bar, and a screw passed through holes provided in the tubular connection member, short bar and connection terminal, and screwed into a nut provided on a lower portion of the connected terminal.

Due to the above described construction, the present invention enables the electrical connections to be made in a reliable manner by bringing the connection terminals of the electrical components into pressured contact with the short bars due to the threaded engagement between the screws and nuts.

Other objects and features of the present invention will become clear from the following description.

BRIEF DESCRIPTION OF THE DRAWINGS

FIG. 2 is an enlarged view of circled portion A of FIG. 1;

FIG. 3 is a sectional view showing an embodiment of a connection portion;

FIG. 4(a) is a front view of a tubular connection member;

FIG. 4(b) is a side view of the tubular connection member of FIG. 4(a);

DESCRIPTION OF THE PREFERRED EMBODIMENTS

The present invention will now be described in detail based on the illustrated embodiments.

Figure 1:
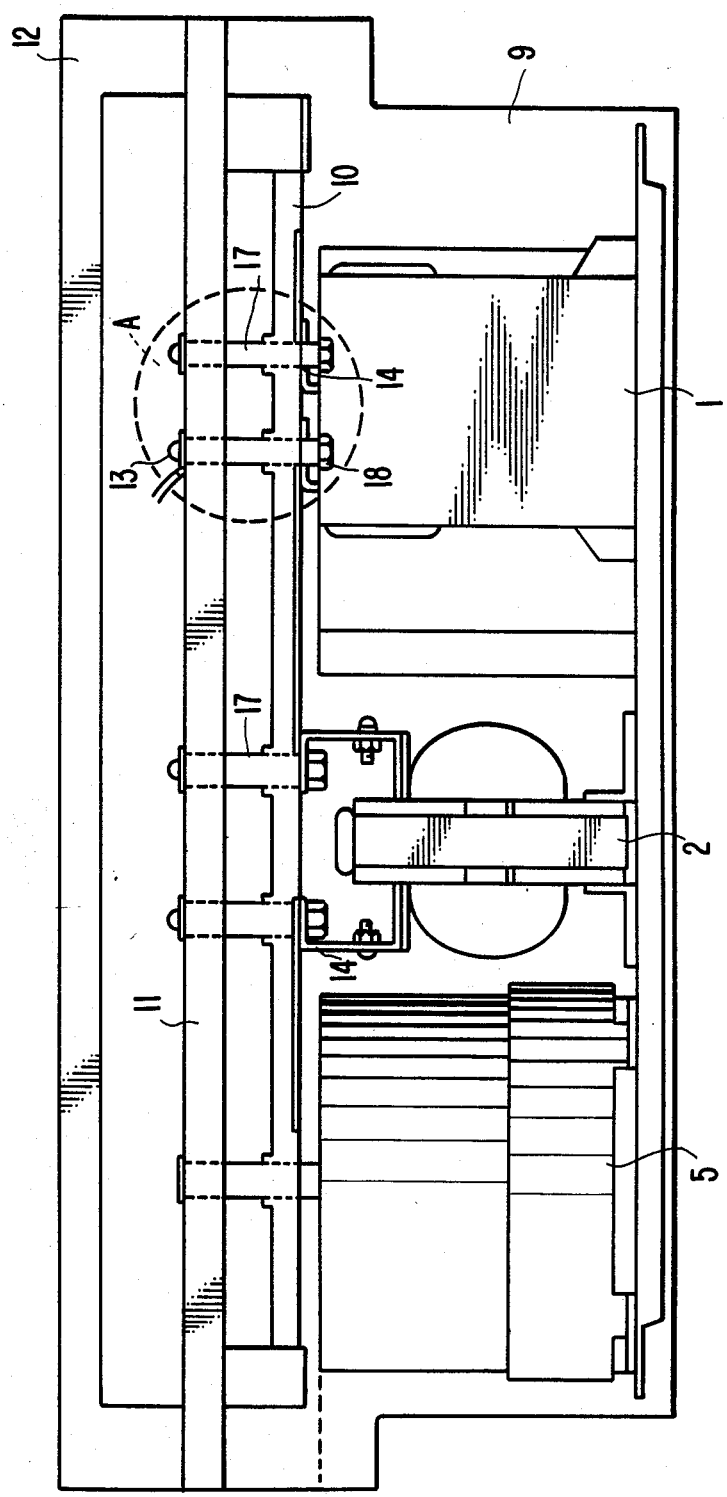
FIG. 1 is a schematic view showing connection of an AC motor control panel according to the present invention.
Figure 9:
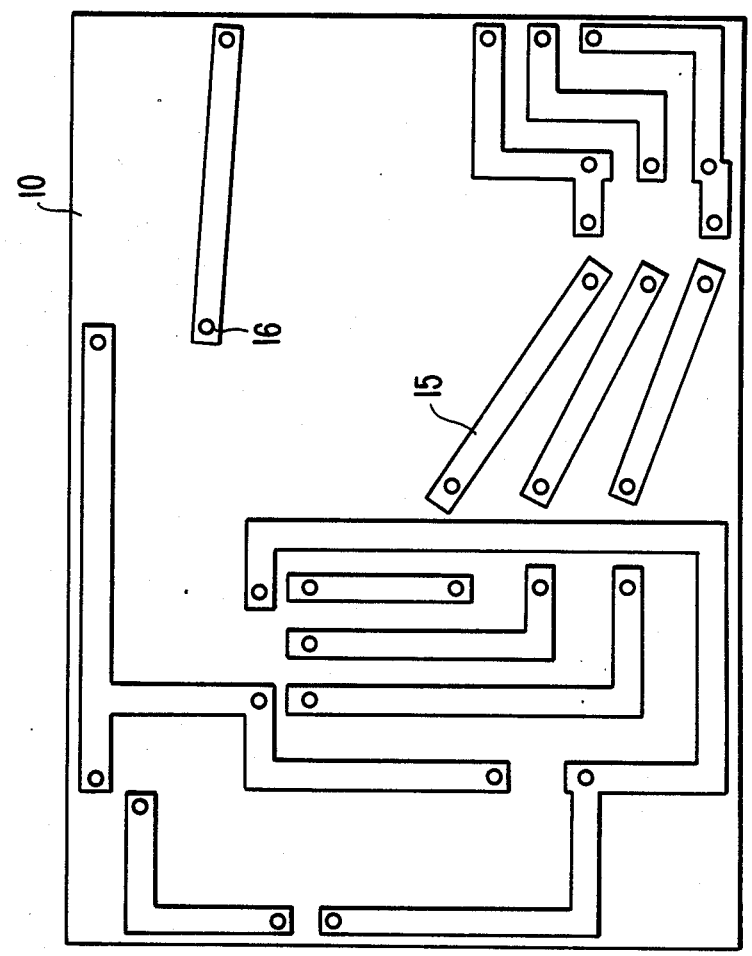
FIG. 9 is a plan view of the short bar substrate for the arrangement of FIG. 8.

FIG. 1 is a schematic view showing connections of a control panel according to the present invention; FIG. 2 is an enlarged view of circled portion A in FIG. 1; FIG. 3 is a sectional view showing an embodiment of a connection portion; FIG. 4(a) is a front view of a tubular connection member; and FIG. 4(b) is a side view of same. Numeral 9 denotes a resin-molded housing the interior of which houses such electrical components as the electromagnetic contactor 1, reactor 2 and smoothing capacitor 5. The terminals 14 of these electrical components are led out onto the upper surface thereof and are arranged to lie on the same plane. The short bar substrate 10, for example of the kind shown in FIG. 9, is placed upon the upper surface of these electrical components accommodated inside the resin-molded housing 9 and the connection terminals of these electronic components are connected on the basis of a predetermined relationship. A printed circuit board 11 is arranged on the short bar substrate 10, and the printed circuit board 11, short bar substrate 10 and electrical components are electrically connected by tubular connection members 17, screws 13 and nuts 18. The connection structure will now be described in detail on the basis of FIGS. 2 through 4(a), (b).

The short bar substrate 10 is placed in such a manner that the short bar 14 will contact the top of the connection terminal 14 led out onto the upper surface of the electrical component. The short bar 15 is fitted secured into a recess provided in the lower surface of the short bar substrate 10. To obtain reliable contact between the short bar and the connection terminal 14, it is arranged so that the lower surface of the short bar protrudes slightly ($t_3$) from below the lower surface of the short bar substrate 10. The mount of protrusion $t_3$ need only be 0.1 to 0.4 mm. The short bar substrate 10 and short bar 15 are provided with respective holes 10b, 15a through which is passed the tubular connection member 17 for effecting electrical connection. The connection terminal 14 is provided with a corresponding hole 14a through which the screw 13 is passed. The short bar substrate 10 consists of a plastic molding material and is integrally molded to include a cylindrical projection 10-1 at the hole 10b to support the tubular connection member 17. With the short bar substrate 10 having been placed on the connection terminal 14 of the electrical component, the tubular connection member 17 is fitted into the hole 10b provided in the short bar substrate 10. The tubular connection member 17 comprises a first portion 17-1 of maximum outer diameter, a second portion 17-2 formed by reducing the outer diameter of the first portion 17-1 by $t_1$ (0.1 mm), and a third portion 17-3 at the tip, formed by reducing the outer diameter of the second portion 17-2 by $t_2$ (0.2 mm). The entire outer surface of the first portion 17-1 of tubular connection member 17 is knurled.

The method of electrically connecting these components will be described next.

First, the short bar substrate 10 is placed so as to situate the corresponding short bar 15 on the lead terminal 14 of the electrical component, and the tubular connection member 17 is pressed into the hole 10b of the short bar substrate 10 from thereabove.

When the tubular connection portion 17 is inserted into the hole 10b, which is formed in the cylinderical portion 10-1 of the short bar substrate 10, burrs are scraped from the cylindrical portion 10-1 and burr fragments collect at the end of the tubular connection member 17 and at the location where the connection is made between the tubular connection member 17 and the short bar 15, thus causing poor contact. To eliminate this difficulty, in the present embodiment the second portion 17-2 of tubular connection member 17 is formed to have the reduced diameter by cutting its outer periphery down by $t_1$ from the first portion 17-1, as set forth above. As a result, a space 22 which receives the burr fragments is formed between the inner circumferential surface of the hole 10b formed in cylindrical portion 10-1 and the second portion 17-2 of the tubular connection member. This makes it possible to prevent poor electrical contact between the tubular connection member 17 and short bar 15. The third portion 17-3 of tubular connection member 17 is formed to have the reduced outer diameter by cutting the second portion 17-2 down by $t_2$. This third portion 17-3 is fitted into the hole 15a of short bar 15, and a shoulder portion 17a, formed at the part of second portion 17-2 where the connection is made, contacts the upper surface of the short bar 15.

After the tubular connection member 17 is fitted into the hole in short bar substrate 10, the printed circuit board 11 is placed on the short bar substrate 10, as shown in FIG. 2, and the first portion 17-1 of tubular connection member 17 is fitted into a hole 11a formed in the printed circuit board 11. Thereafter, the screw 13 is passed through a connection terminal 23 fixedly secured to the printed circuit board 11 and then through the tubular connection member 17. The distal end portion of the screw 13 is screwed into the nut 18 provided on the bottom portion of the connection terminal 14 of the electrical component. The connection terminal 14 and short bar 14 can thus be brought into pressurized contact to provide a sure electrical connection. It goes without saying that the short bar 15 and connection terminal 23 of printed circuit board 11 are electrically connected by screwing the screw 13 into the nut 18.

The control panel constructed in this manner enables the electrical connections to be reliably effected. In addition, the connections are made with facility since connection can be performed by using a screw tightener.

Figure 5:
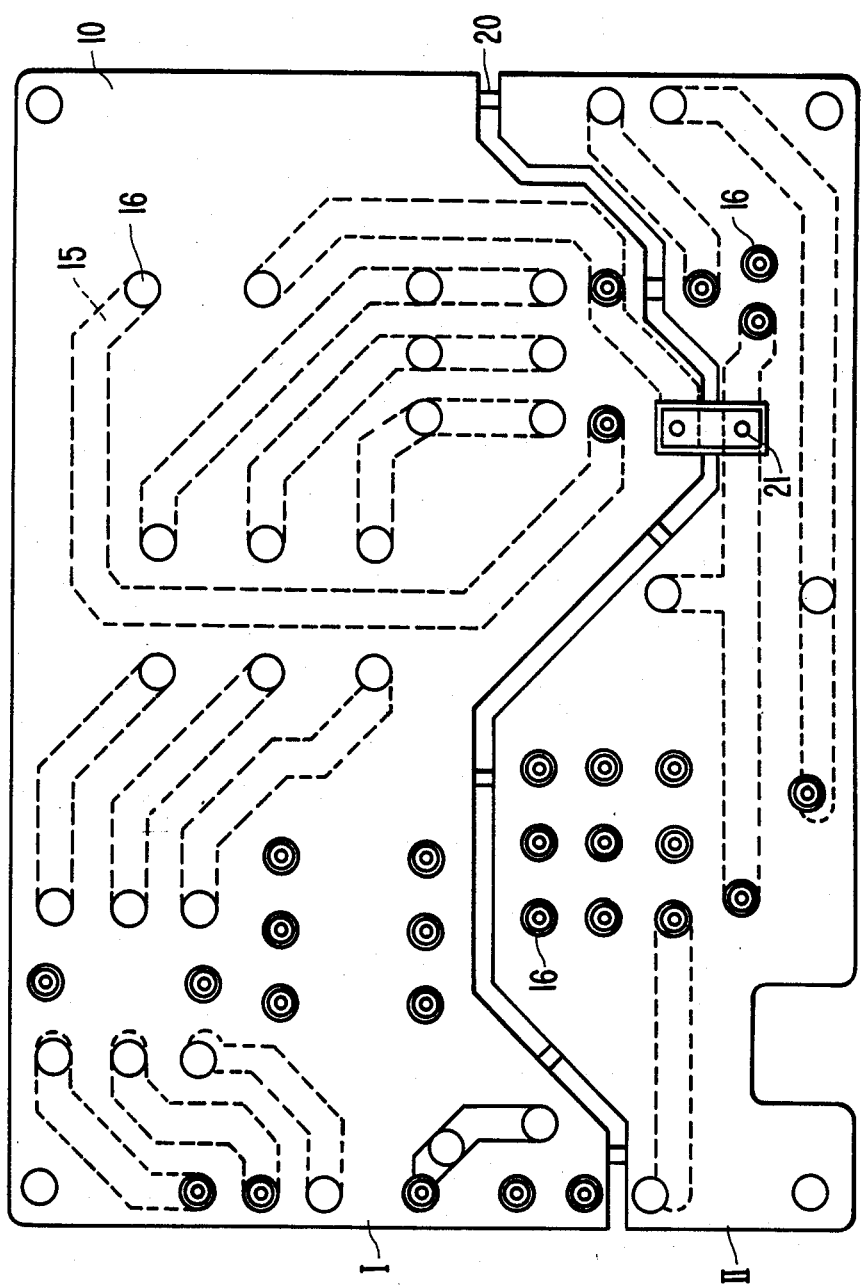
FIG. 5 is a plan diagram of a short bar substrate in accordance with another embodiment of the present invention.
Figure 6:
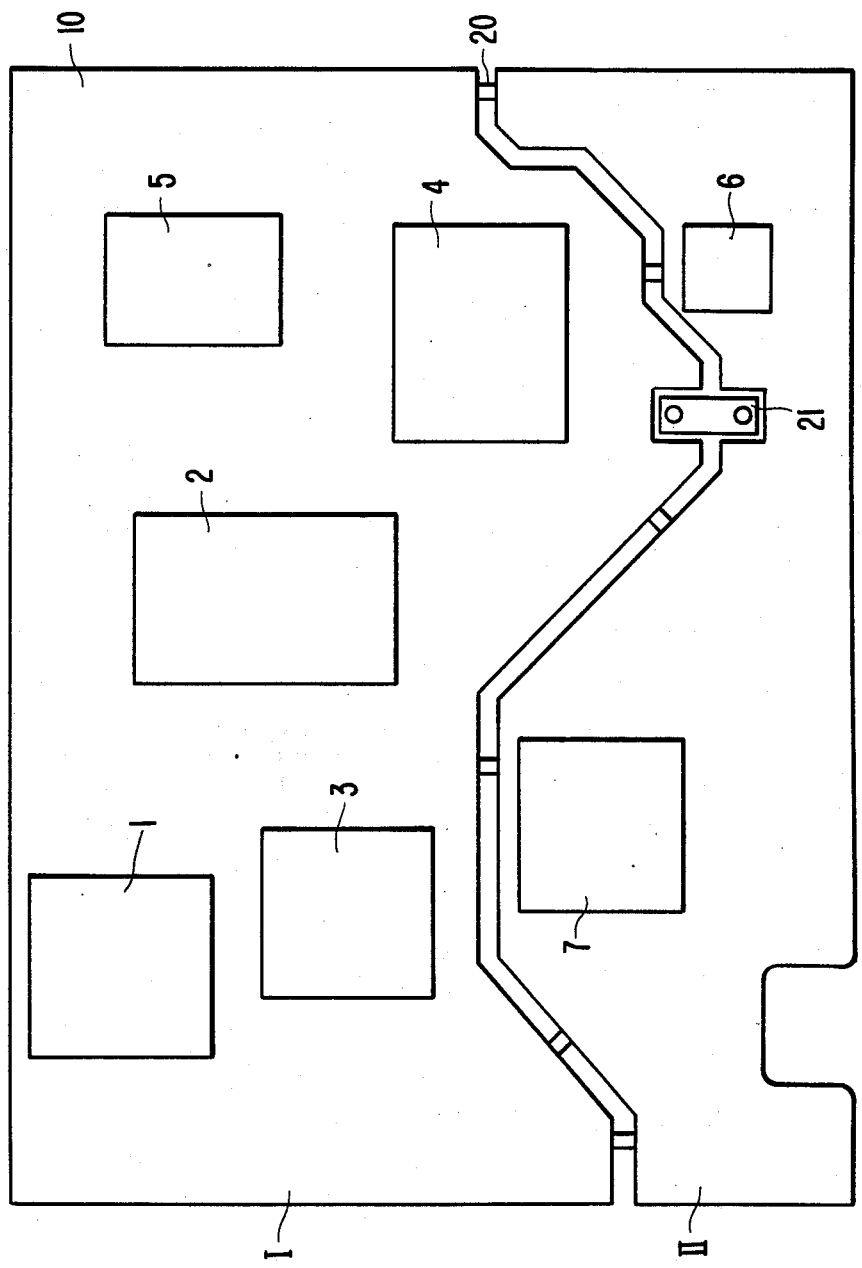
FIG. 6 is a view for describing electrical component arrangement positions corresponding to the short bar substrate of FIG. 5.
Figure 7:
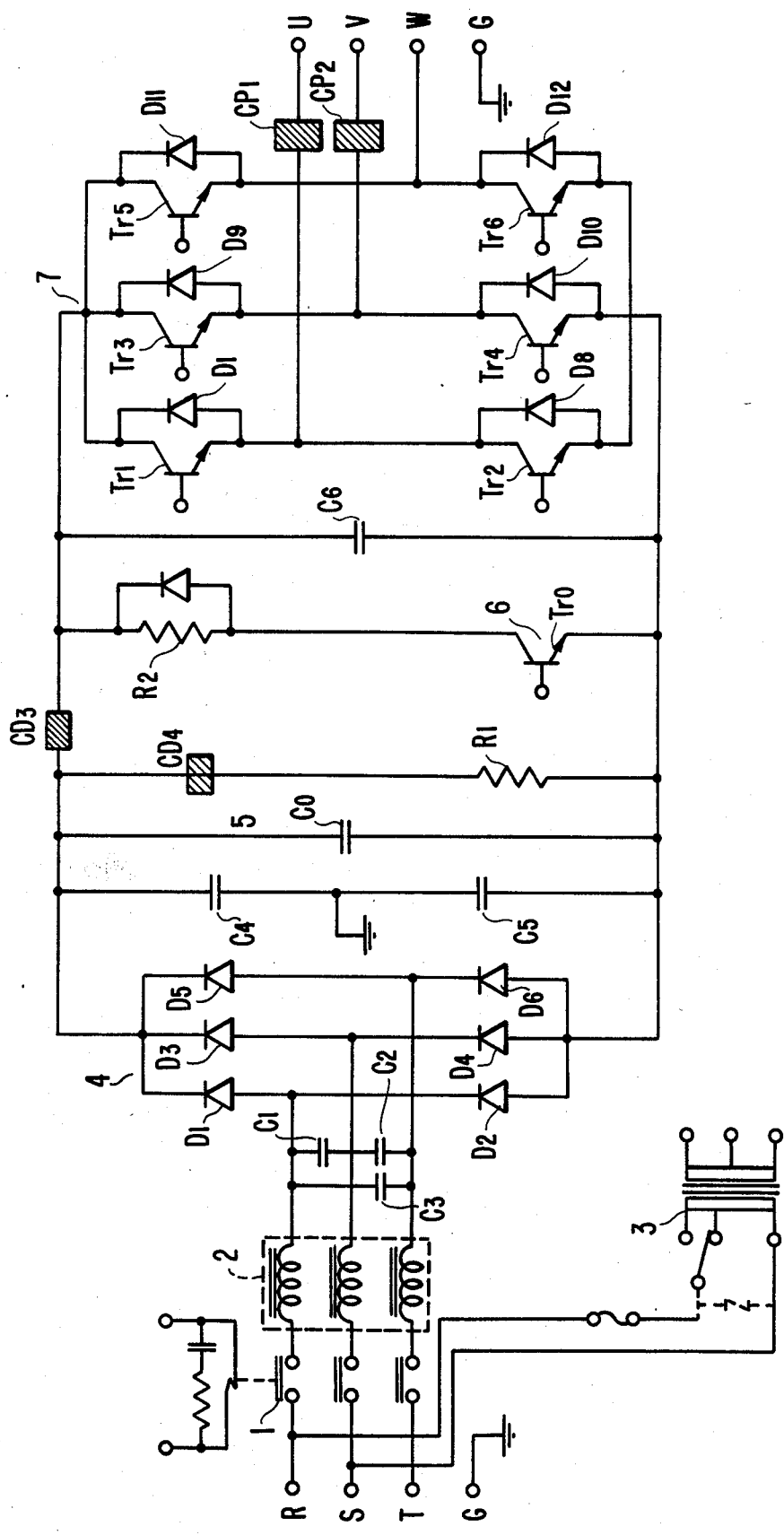
FIG. 7 is a circuit diagram of an inverter circuit for an AC motor.
Figure 8:
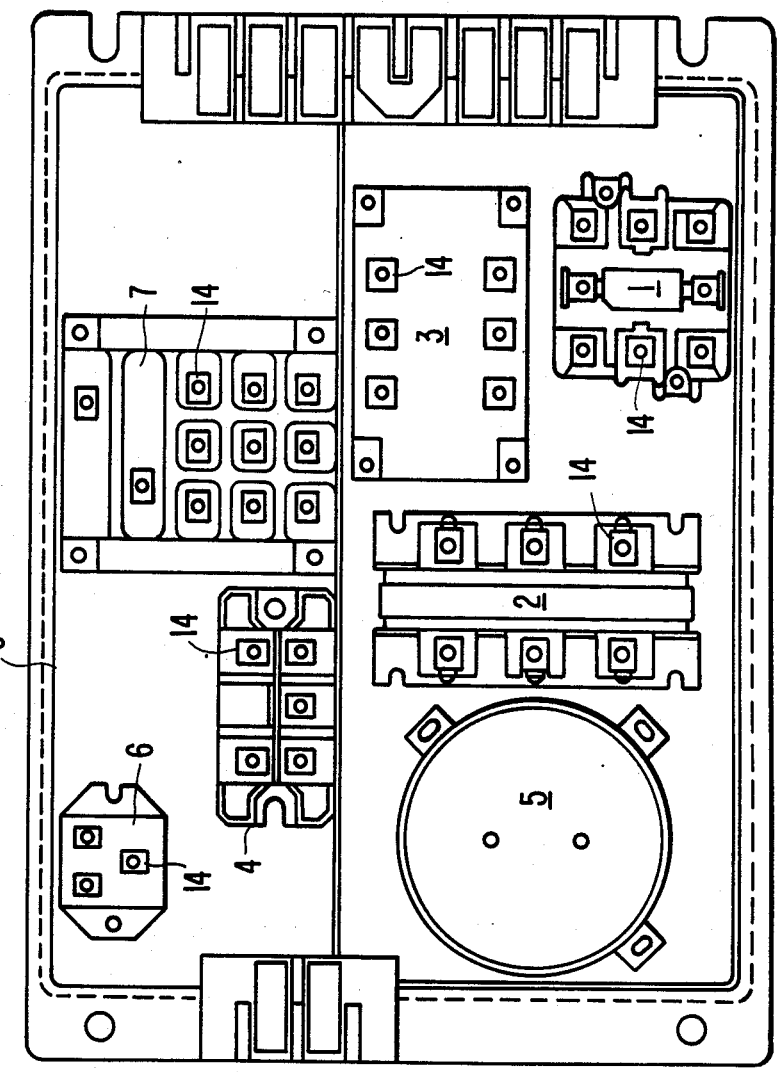
FIG. 8 is a diagram of the arrangement of electrical components constituting the inverter control circuit of FIG. 7.

FIGS. 5 and 6 illustrate another embodiment of the present invention. FIG. 5 is a plan view of the short bar substrate, and FIG. 6 is a diagram of electrical component arrangement positions corresponding to the short bar substrate.

In a case where a large number of electrical components are to be incorporated, as shown in FIGS. 5 and 6, it can be predicted in economic terms, depending upon the particular components, which components will have a high failure rate and which will have a limited life. These components are only a fraction of the total number of components in the assembly. Discarding the entire control panel and replacing it with a new control panel just because of these small number of components is very uneconomical. Accordingly, in the embodiment of FIGS. 5 and 6, the arrangement is such that only those electrical components among the assembled electrical components that have a high failure rate and a short life can be replaced.

Let us now explain this point in detail. As is evident from FIG. 6, the electromagnetic contact 1, reactor 2, control transformer 3, diode bridge 4, smoothing capacitor 5, discharge transistor 6 for regeneration and transistor inverter 7 are arranged at positions corresponding to the short bar substrate 10. Among these electrical components, the regenerative discharge transistor 6 and transistor inverter 7 are unavoidably subjected to electrically severe use and cannot help but have a higher failure rate and shorter life in comparison with the other electrical components.

Accordingly, the arrangement is such that these electrical components of high failure rate, such as the regenerative discharge transistor 6 and transistor inverter 7, are disposed in a second region II capable of being readily separated from a first region I in which the other components are disposed. To this end, an electrical connection is contrived between the second region II of the short bar substrate 10 and the first region I via a jumper conductor plate 21, and the first and second regions I, II are connected at several points by plastic-molded members 20. Then, when it is necessary to separate the second region II from the first region I, the jumper conductor plate 21 is removed and the plastic-molded members 20 are cut away.

Though the present invention has been described based on the illustrated embodiments, the invention is not limited to these embodiments but can be modified in various ways in accordance with the gist of the present invention, such modifications being within the scope of the invention.

The present invention is not limited solely to control panels of AC motors but can also be applied to, e.g., control panels of converters for DC motor drive and control panels of inverters used for other purposes.

What is claimed is:

1. An AC motor control panel comprising:
   an electrical component arranged in a housing and constituting an inverter control circuit of an AC motor, said electrical component having an upper surface with a connection terminal led out thereover, said connection terminal having a hole therein;
   a short bar substrate placed upon said connection terminal which is led out over the upper surface of said electrical component, said short bar substrate having a short bar which contacts said connection terminal and is fixedly secured thereto, said short bar and said short bar substrate each having a hole at a portion corresponding to said connection terminal;
   a tubular connection member inserted into the hole provided in said short bar substrate and contacting said short bar, said tubular connection member having a hole;
   a screw passed through the holes provided in each tubular connection member, said short bar substrate said short bar and said connection terminal; and
   a nut positioned below said connection terminal and engaging said screw.

2. An AC motor control panel comprising:
   an electrical component arranged in a housing and constituting an inverter control circuit of an AC motor, said electrical component having an upper surface with a connection terminal led out thereover, said connection terminal having a hole therein;
   a short bar substrate placed upon said connection terminal which is led out over the upper surface of said electrical component, said short bar substrate having a short bar which contacts said connection terminal and is fixedly secured thereto, said short bar and said short bar substrate each having a hole at a portion corresponding to said connection terminal;
   a tubular connection member inserted into the hole provided in said short bar substrate and contacting said short bar, said tubular connection member having a hole;
   a printed circuit board positioned over said short bar substrate and having a hole which mates with said tubular connection member;
   a screw passed through the holes provided in said printed circuit board, said tubular connection member, said short bar substrate, said short bar and said connection terminal; and
   a nut positioned below said connection terminal and engaging said screw.

3. An AC motor control panel according to claim 1, wherein the hole portion of said short bar substrate is formed by a cylindrical projection.

4. An AC motor control panel according to claim 1, wherein said tubular connection member has a tip portion with a reduced outer diameter, and wherein said tip portion is adjacent said short bar.

5. An AC motor control panel according to claim 1, wherein said short bar is formed to project from a lower surface of said short bar substrate.

6. An AC motor control panel according to claim 1, wherein said short bar substrate has first and second regions, wherein electrical components having a high failure rate are connected on said second region, and wherein said second region can be detached from said first region.

7. An AC motor control panel according to claim 2, wherein the hole portion of said short bar substrate is formed by a cylindrical projection.

8. An AC motor control panel according to claim 2, wherein said tubular connection member has a tip portion with a reduced outer diameter, and wherein said tip portion is adjacent said short bar.

9. An AC motor control panel according to claim 2, wherein said short bar is formed to project from a lower surface of said short bar substrate.

10. An AC motor control panel according to claim 2, wherein said short bar substrate has first and second regions, wherein electrical components having a high failure rate are connected on said second region, and wherein said second region can be detached from said first region.

11. An electrical connector connecting a connection terminal of an electrical component to a short bar of a short bar substrate positioned over the connection terminal, the connection terminal having a hole therein, the short bar and the short bar substrate each having a hole at a portion corresponding to the connection terminal, said electrical connector comprising:
    a tubular connection member inserted into the hole provided in the short bar substrate and electrically contacting the short bar, said tubular connection member having a hole;
    a screw extending through the hole provided in said tubular connection member and through the holes in the short bar, the short bar substrate and the connection terminal;
    a nut positioned below the connection terminal, and engaging said screw.

12. An electrical connector according to claim 11, wherein said tubular connection member has a tip portion with a reduced outer diameter, and wherein said tip portion is adjacent the short bar.

13. An electrical connector according to claim 12, wherein a printed circuit board is positioned over the short bar substrate, wherein the printed circuit board has a connection terminal with a hole corresponding to the hole in said tubular connection member, and wherein said screw is also passed through the hole in the connection terminal of the printed circuit board, so that the connection terminal of the printed circuit board is electrically connected to the connection terminal of the electrical component via said nut and said screw.

14. An electrical connector according to claim 11, wherein the hole portion of the short bar substrate is formed by a cylindrical projection.

15. An electrical connector according to claim 11, wherein a printed circuit board is positioned over the short bar substrate, wherein the printed circuit board has a connection terminal with a hole corresponding to the hole in said tubular connection member, and wherein said screw is also passed through the hole in the connection terminal of the printed circuit board, so that the connection terminal of the printed circuit board is electrically connected to the connection terminal of the electrical component via said nut and said screw.

* * * * *

UNITED STATES PATENT AND TRADEMARK OFFICE
CERTIFICATE OF CORRECTION

PATENT NO. : 4,677,540
DATED : JUNE 30, 1987
INVENTOR(S) : YOSHIKI FUJIOKA

It is certified that error appears in the above-identified patent and that said Letters Patent is hereby corrected as shown below:

```
Col. 1, line 42, "components" should be --components,--.

Col. 2, line 17, "connected" should be --connection--;
        line 39, "diagram" should be --view--;
        line 42, "view" should be --diagram--.

Col. 3, line 14, "14" should be --15--.

Col. 6, line 50, "terminal," should be --terminal--.
```

Signed and Sealed this

Eighth Day of December, 1987

Attest:

DONALD J. QUIGG

*Attesting Officer*     *Commissioner of Patents and Trademarks*